United States Patent
Chang

(10) Patent No.: US 10,472,171 B2
(45) Date of Patent: Nov. 12, 2019

(54) STORAGE FRAME STRUCTURE FOR AUTOMATIC DEPOT

(71) Applicant: Chih Lu Chang, New Taipei (TW)

(72) Inventor: Chih Lu Chang, New Taipei (TW)

( * ) Notice: Subject to any disclaimer, the term of this patent is extended or adjusted under 35 U.S.C. 154(b) by 0 days.

(21) Appl. No.: 16/107,492

(22) Filed: Aug. 21, 2018

(65) Prior Publication Data

US 2019/0084761 A1    Mar. 21, 2019

(30) Foreign Application Priority Data

Sep. 15, 2017 (TW) .............................. 106213824 U
Sep. 15, 2017 (TW) .............................. 106213825 U
Sep. 15, 2017 (TW) .............................. 106213826 U

(51) Int. Cl.
*B65G 1/04* (2006.01)
*B65G 1/137* (2006.01)
*B65G 1/14* (2006.01)
*H05K 13/00* (2006.01)

(52) U.S. Cl.
CPC .......... *B65G 1/0421* (2013.01); *B65G 1/0464* (2013.01); *B65G 1/137* (2013.01); *B65G 1/14* (2013.01); *H05K 13/0015* (2013.01); *H05K 13/0084* (2013.01)

(58) Field of Classification Search
CPC .... B65G 1/0421; B65G 1/0464; B65G 1/137; B65G 1/14; B65D 25/04; B65D 25/107; B65D 85/00; H05K 13/0015; H05K 13/0084; A47F 7/0042; A47F 7/0057; A47F 7/16; A47F 7/163; A47B 81/068; A47B 81/06; B42F 17/08; B42F 17/02

USPC ......... 211/41.1, 40, 184, 45, 50, 44, 126.13, 211/126.1, 126.2, 126.3, 41.18, 41.13, 211/41.12; 206/307, 449, 485, 486, 557, 206/561

See application file for complete search history.

(56) References Cited

U.S. PATENT DOCUMENTS

| | | | | |
|---|---|---|---|---|
| 4,574,959 A | * | 3/1986 | Hollett | H05K 13/0069 206/728 |
| 4,976,092 A | * | 12/1990 | Shuert | B42F 17/12 108/55.1 |
| 5,097,946 A | * | 3/1992 | Emrich | G11B 33/0455 206/308.1 |
| 5,103,986 A | * | 4/1992 | Marlowe | G11B 23/0236 206/387.15 |
| 5,201,414 A | * | 4/1993 | Kaszubinski | G11B 33/0472 206/308.1 |

(Continued)

*Primary Examiner* — Jennifer E. Novosad
(74) *Attorney, Agent, or Firm* — Wang Law Firm, Inc.

(57) ABSTRACT

A storage frame structure for an automatic depot includes: several space limiting units, each having a plug-in surface formed with vertical slots and two opposite ends, at least one of the opposite ends being formed with an insert hole; several fixing rods abutting with the limiting units respectively; two side plates connected to the fixing rods in such a manner that the fixing rods extend parallel to one another between the side plates; and two positioning plates, each having two opposite insert ends extending into the vertical slots of an adjacent pair of the limiting units, thereby defining a reception chamber therebetween to retain a material tray stably in the chamber. The storage frame structure has simple construction and is applicable in automation industry (like SMT electronic industry) for material storing and sorting.

10 Claims, 9 Drawing Sheets

(56) References Cited

U.S. PATENT DOCUMENTS

| | | | | |
|---|---|---|---|---|
| 5,464,091 A * | 11/1995 | Callahan | G11B 33/0438 | 206/308.3 |
| 5,586,650 A * | 12/1996 | Yeh | G11B 33/0444 | 206/308.1 |
| 5,590,770 A * | 1/1997 | Yeh | G11B 33/0444 | 206/308.1 |
| 5,617,950 A * | 4/1997 | Chung | G11B 33/0444 | 206/308.1 |
| 5,634,563 A * | 6/1997 | Peng | G11B 33/0483 | 206/308.1 |
| 5,725,105 A * | 3/1998 | Boland | G11B 33/0455 | 211/40 |
| 5,833,062 A * | 11/1998 | Yeh | G11B 33/0472 | 206/307.1 |
| 6,039,190 A * | 3/2000 | Clausen | G11B 23/0236 | 206/308.1 |
| 6,073,764 A * | 6/2000 | Haas | A47F 7/141 | 206/308.1 |
| 6,126,020 A * | 10/2000 | Mok | G11B 23/0236 | 108/147.11 |
| 6,145,663 A * | 11/2000 | Kim | B65D 81/113 | 206/454 |
| 6,203,129 B1 * | 3/2001 | Kupferschmid | G11B 17/22 | 206/387.1 |
| 6,332,546 B1 * | 12/2001 | Hunt | B42F 17/08 | 211/10 |
| 6,371,300 B1 * | 4/2002 | Uchida | G11B 33/0422 | 206/308.1 |
| 6,557,710 B1 * | 5/2003 | Levine | G11B 23/0236 | 211/40 |
| 6,991,115 B2 * | 1/2006 | Chow | G11B 33/0483 | 211/188 |
| 7,191,899 B2 * | 3/2007 | Garcia, Jr. | G11B 33/0422 | 206/308.1 |
| 2002/0108915 A1 * | 8/2002 | Stitt | G11B 15/682 | 211/41.12 |
| 2004/0124162 A1 * | 7/2004 | Yi | G11B 33/0455 | 211/40 |
| 2005/0082240 A1 * | 4/2005 | Ohayon | G11B 33/0433 | 211/40 |
| 2005/0199562 A1 * | 9/2005 | Yu | A47B 81/068 | 211/40 |
| 2005/0274636 A1 * | 12/2005 | Choi | B65D 85/544 | 206/308.1 |
| 2007/0251896 A1 * | 11/2007 | Lau | G11B 33/0444 | 211/40 |
| 2019/0084761 A1 * | 3/2019 | Chang | B65G 1/0421 | |

* cited by examiner

STORAGE FRAME STRUCTURE FOR AUTOMATIC DEPOT

CROSS-REFERENCE TO RELATED APPLICATION

This application claims the priority of Taiwanese patent application No. 106213824, filed on Sep. 15, 2017, Taiwanese patent application No. 106213825, filed on Sep. 15, 2017, and Taiwanese patent application No. 106213826, filed on Sep. 15, 2017, which are incorporated herewith by reference.

BACKGROUND OF THE INVENTION

1. Field of the Invention

The present invention relates generally to a storage frame structure, and more particularly an assemble-type storage frame structure for an automatic depot or warehouse.

2. The Prior Arts

The application frequency of depot or warehouse differs from one another due to different of goods and/or products manufactured by different industries and enterprises. But for an enterprise, which deals in many types of materials and needing to store a large amount of products, storage management is directly related to the enterprise's product management and plays a decisive role for the enterprise.

Taking SMT (Surface Mount Technology) as an example, SMT is a basic industry in the field of electronic manufacturing. Therefore, it can be learned that distribution of materials from a warehouse is one of SMT (Surface Mount Technology) important processes, mainly includes distribution and transportation of materials, filling up the warehouse with products or materials and accepting the return products, etc.

However, most of the existing storage and delivery system uses paper list of materials and manual identification to find the required products. This storage system generates low efficiency, high error rate, is poor in real-time update of products, and the workers needs high operating skills. It requires a longer period of time to train for skilled workers, who can effectively carry out the processes of storing, discharging and the like. Further, in order to be able to classify and store the materials or products effectively and accurately, the storage locations of different types of materials are mostly fixed settings. In order to skillfully and accurately perform the operation process such as storing and discharging, the technical requirements for the workers and operators need further improvement.

Due to the characteristics of high-volume and multi-varieties in the electronic product manufacturing industry, many types of materials are used. If the materials are managed and delivered by hand, there exists the problem of finding difficulties and consuming time. Therefore, to consider the automation of material storage, delivery and transportation, and to shorten the time of material search and identification, the production and delivery efficiency should be enhanced.

At present, with the development of science and technology, SMT industry begins to carry out an automated mode of material storage and material sorting. However, most of the existing material shelves are in the form of steel shelves. It is difficult to use automatic storing and sorting of materials or products in such type of storage system.

Owing to the above-stated disadvantages, the inventor has invented an assemble-type storage frame structure for an automatic depot so as to remedy the above-stated disadvantages.

SUMMARY OF THE INVENTION

A primary objective of the present invention is to provide an assemble-type storage frame structure for an automatic depot or warehouse such that the storage frame structure has simple construction, but in which material trays can be stably and firmly retained for automatic storing and/or access to products (for example, SMT electronic materials).

A secondary objective of the present invention is to provide an assemble-type storage frame structure for an automatic depot or warehouse, the application of which results in an effective way to achieve an orderly classification, speed up the automatic storage system of material access, and can shortened material search and fetching time, enhance production efficiency, while increasing shelf space utilization, and further savings the manual labor costs.

In order to achieve the preceding objective, a storage frame structure for an automatic depot of the present invention includes: a plurality of space limiting units, each space limiting unit having a plug-in surface dented in such a manner to form a plurality of spaced apart vertical slots and two opposite ends, at least one of the opposite ends being formed with an insert hole; a plurality of fixing rods abutting with the plurality of space limiting units respectively; at least two side plates, one of the side plates having one end portion connected to one end of the fixing rod while the other end of the fixing rod is connected to remaining one of the side plates in such a manner that the plurality of fixing rods extend parallel to one another between the side plates in such a manner to define an insertion chamber between an adjacent pair of the fixing rods; and at least two positioning plates, each positioning plate having two opposite insert ends extending into the vertical slots in the plug-in surfaces of an adjacent pair of the limiting units, thereby erecting the positioning plate vertically in the insertion chamber such that the two positioning plates cooperatively define a reception chamber therebetween, each positioning plate further having two opposite sides respectively defining two positioning surfaces, each is formed with a plurality of vertical positioning ribs and has two top ends and a middle portion between the two top ends and formed with an opening at the middle portion of a respective one of the positioning plates.

The storage frame structure of the present invention further includes a material tray consisting of a two-piece annular body and a tube interconnected the centers of the two-piece body, wherein each of the plurality of vertical positioning ribs defines an inclined guiding portion adjacent to a respective one of the two top ends of the positioning plate for guiding the material tray towards a center of the reception chamber between the two positioning plates.

Preferably, each positioning surface of a respective one of the positioning plates further has a plurality of horizontal positioning ribs transversely extending between and interconnecting an adjacent pair of the vertical positioning ribs such that the vertical and horizontal positioning ribs are in contact with one outer side surface of the material tray so as to secure retention of the material tray within the reception chamber.

Preferably, the two top ends of each of the positioning plates gradually diverge toward the middle portion in order to define the opening at the middle portion such that the opening is located at a level below the two top ends of a respective one of the positioning plates so as to permit access of an external clamp device for fetching by clamping a center of the material tray.

Preferably, each of the space limiting units consists of a first limiting block and a second limiting block coupled to the first limiting block, each of the first and second limiting blocks having the plug-in surface and a joint surface opposite to the plug-in surface and is dented in such a manner to define a shallow recess with an access such that when the joint surfaces of the first and second limiting blocks are coupled to each other, the pair of accesses cooperatively define the insert hole in the first and second limiting blocks.

Preferably, each joint surface of a respective one of the first and second limiting blocks is formed with a plurality of plug units and socket units spaced apart from one another such that each socket unit has a socket hole.

Preferably, once the joint surfaces of the first and second limiting blocks are attached together, the plug units extend respectively into the socket holes in the socket units after attachment, thereby interactively connecting the first and second limiting blocks to define a respective one of the space limiting units, each joint surface of a respective one of the first and second limiting blocks is formed with a plurality of rod-confining elements, each including a connection part extending outwardly from a bottom surface of the shallow recess, a restricting part integrally formed with the connection part and a confining part encircling around a portion of an external surface of a respective one of the fixing rods such that the fixing rod is retained between the first and second limiting blocks.

Preferably, each joint surface of a respective one of the first and second limiting blocks is formed with a plurality of rod-abutting sticks adjacent to the rod-confining elements, each rod-abutting stick extending outwardly from the bottom surface of the shallow recess for abutting the remaining portion of the external surface of a respective one of the fixing rods such that the fixing rod is retained stably and securely between the first and second limiting blocks.

Preferably, each of the positioning plates and the plug-in surface of a respective one of the space limiting units extend perpendicularly relative to each other such that an adjacent pair of the positioning plates define the reception chamber vertically therebetween.

Preferably, the storage frame structure of the present invention further includes a material box fabricated from anti-static composite plastic materials and defining an accommodation room, in which the space limiting units, the fixing rods and the side plates are accommodated.

One distinct feature of the present invention resides in that since the storage frame structure is an assemble-type, the side plates can be detachably connected to a plurality of the fixing rods and after which a plurality of space limiting units are integrated to the fixing rods in such a manner that once two opposite insert ends of a certain number of the positioning plates are inserted into vertical slots in the space limiting units, a reception chamber of variable size is defined between an adjacent pair of the positioning plates. Note the dimension of the reception chamber differs depending on extension of the insert ends of the positioning plates into the position of the vertical slots in the space limiting units. The positioning plates further have vertical positioning ribs for guiding a material tray into the reception chamber and horizontal position ribs transversely extending between and interconnecting an adjacent pair of the vertical positioning ribs such that the vertical and horizontal ribs cooperatively abut an outer side surface of the material tray so as to secure retention of the material tray in the reception chamber.

Another distinct feature of the present invention resides in that the space limiting units, the fixing rods and the side plates can be accommodated in a material box, which is fabricated from anti-static composite materials. When the storage frame structure of the present invention is applied in the SMT automation system, storing and sorting of the material trays can be simultaneously controlled, thereby resulting in effective way to achieve an orderly classification and speed up the automatic storage and sorting operations.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1:
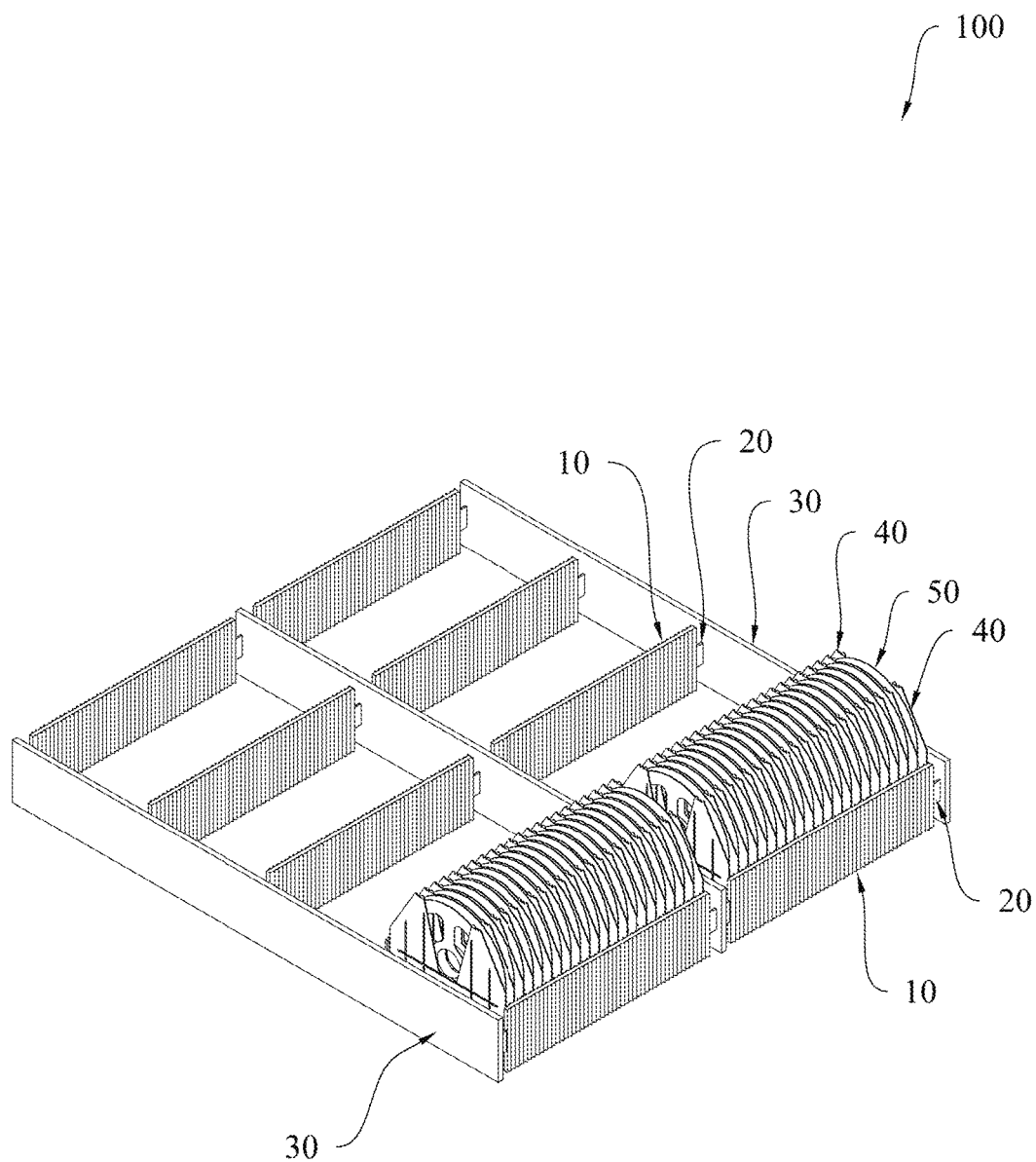
FIG. 1 is a perspective view of an assemble-type storage frame structure for automatic depot according to a first embodiment of the present invention.
Figure 2:
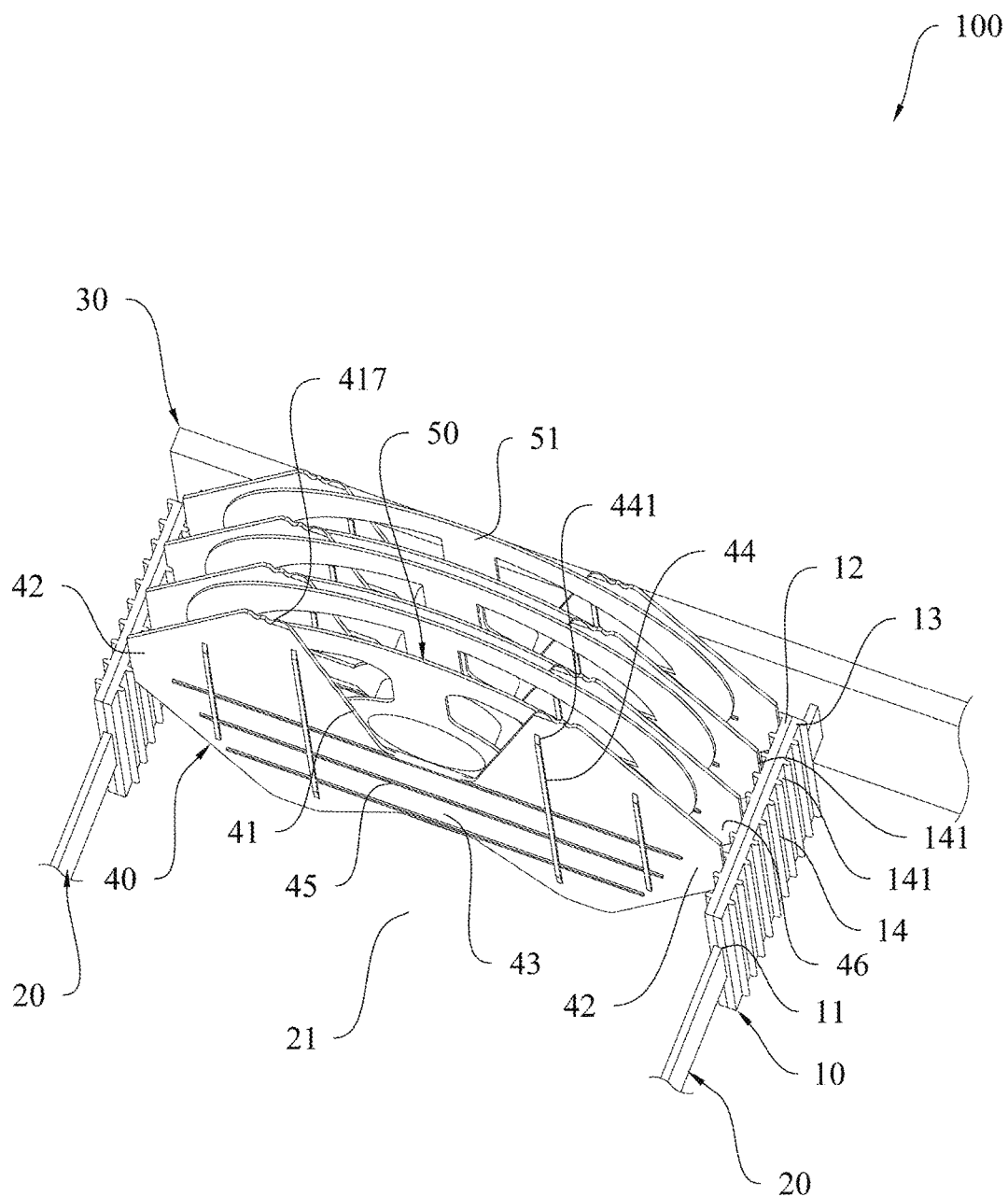
FIG. 2 is an enlarged fragmentary view of the storage frame structure for automatic depot according to the first embodiment of the present invention.

The accompanying drawings are included to provide a further understanding of the invention, and are incorporated in and constitute a part of this specification. The drawings illustrate embodiments of the invention and, together with the description, serve to explain the principles of the invention.

Referring to FIGS. 1-2 and 3-6, the storage frame structure 100 of the present invention is applied in a SMT automation system and includes a plurality of space limiting units 10, a plurality of fixing rods 20, a plurality of side plates 30 and a plurality of positioning plates 40.

Figure 4:
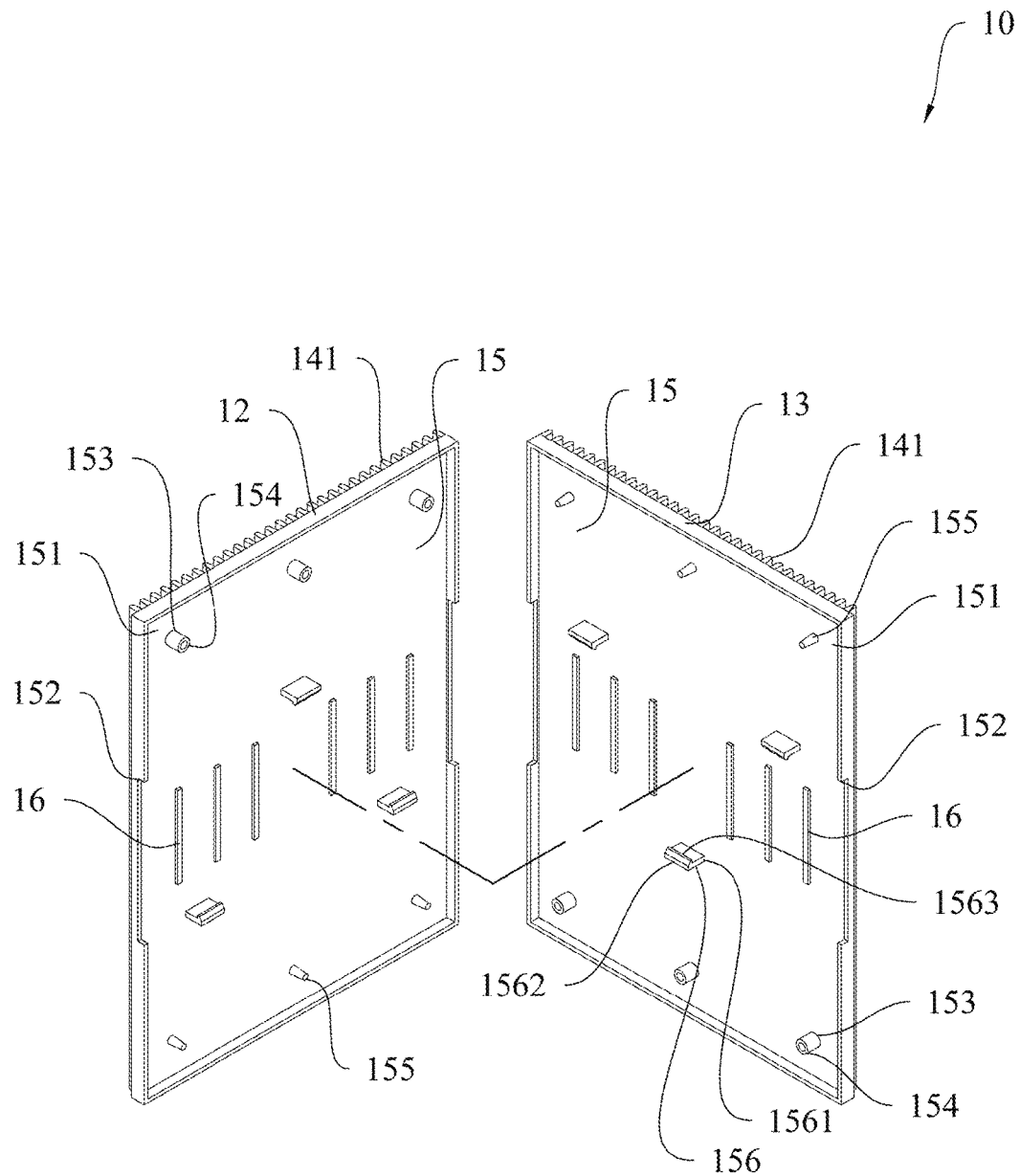
FIG. 4 is an exploded view of a space limiting unit employed in the storage frame structure for automatic depot according to the first embodiment of the present invention.
Figure 5:
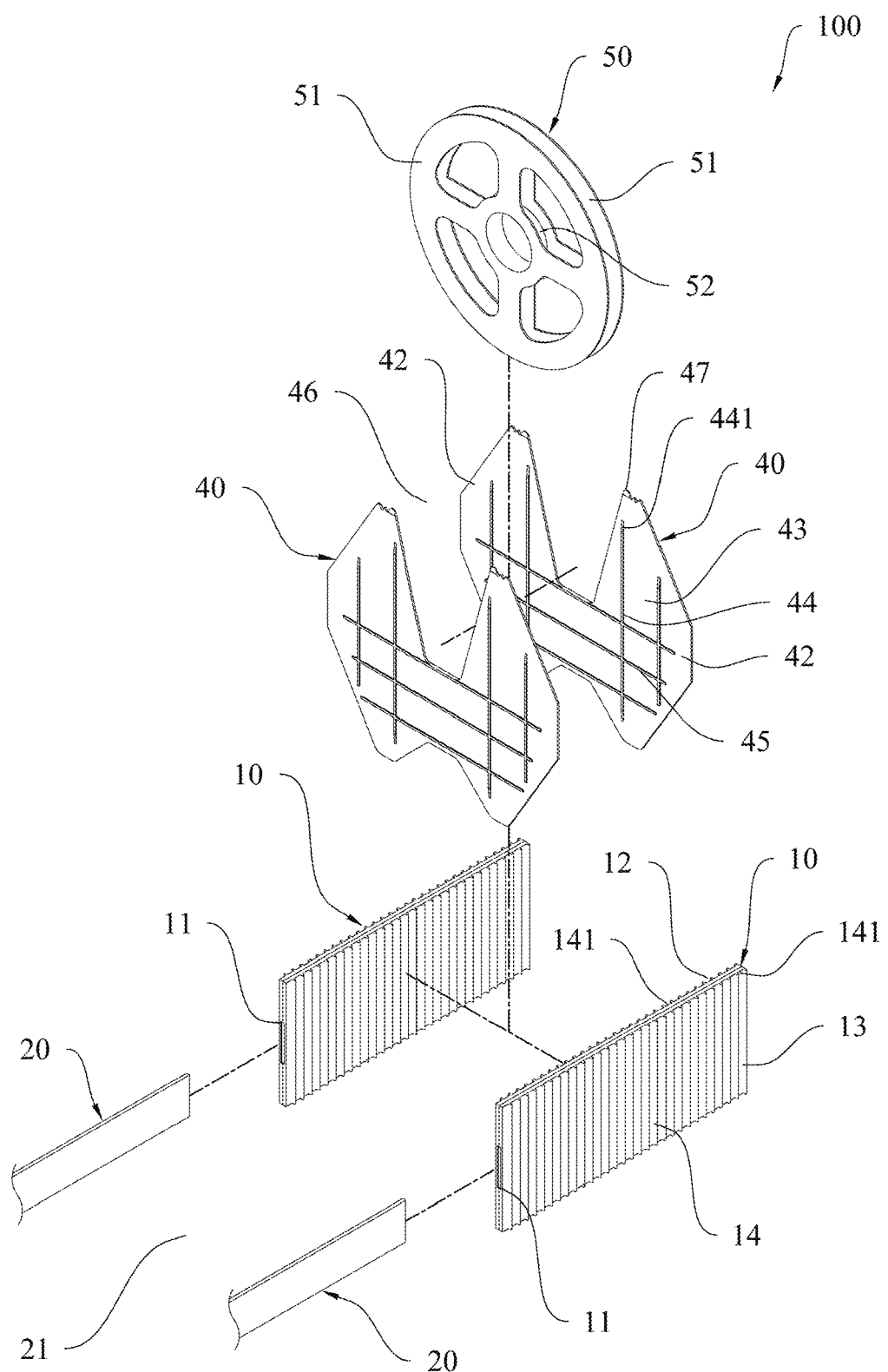
FIG. 5 is an exploded view of the storage frame structure for automatic depot according to the first embodiment of the present invention, illustrating connection relationship among the space limiting units, the positioning plate, a fixing rod and a material tray.
Figure 6:
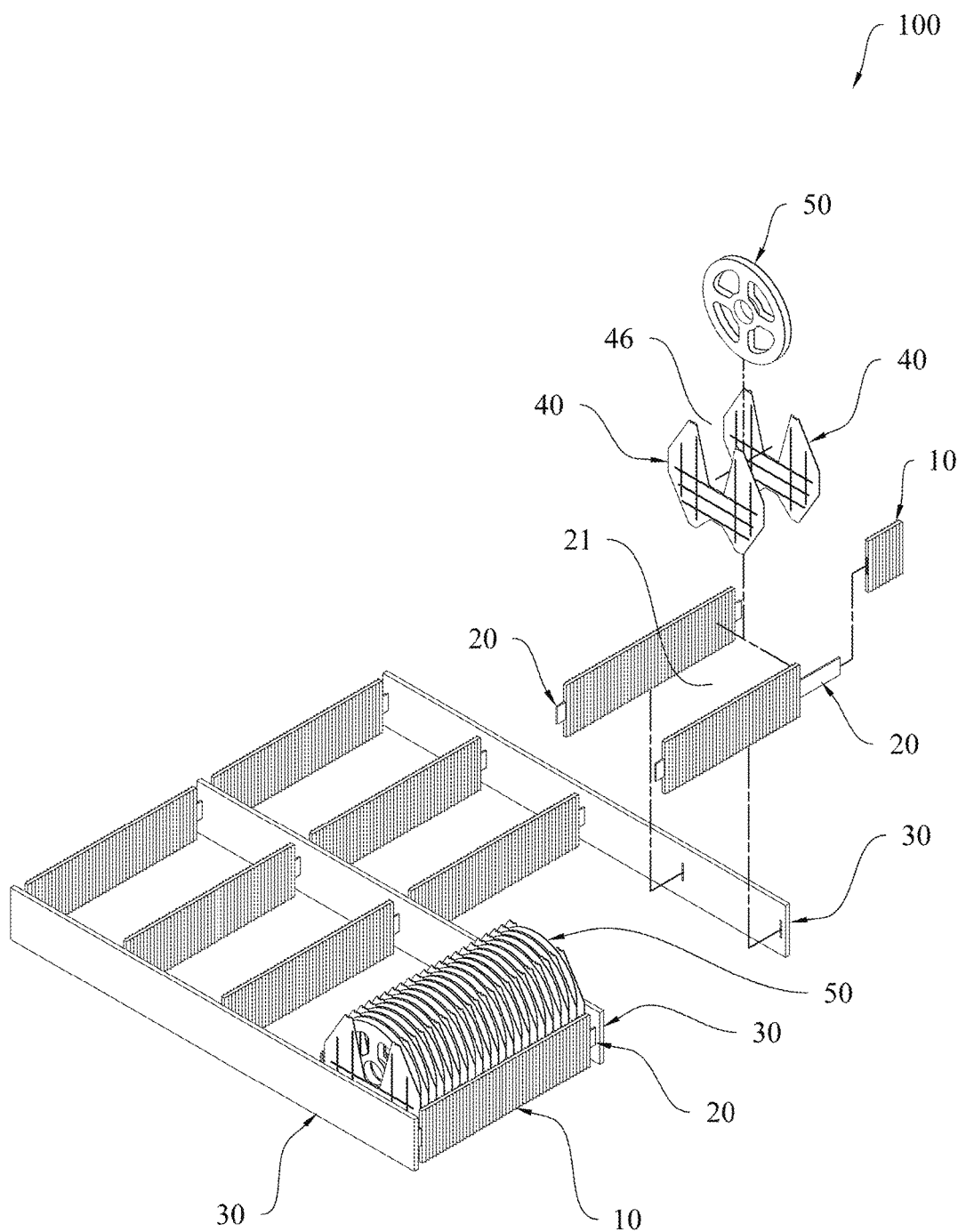
FIG. 6 is an exploded view of the storage frame structure for automatic depot according to the first embodiment of the present invention, illustrating connection relationship among the space limiting units, the positioning plate, the fixing rod, the material tray and a side plate.

Each space limiting unit 10 has a plug-in surface 14 dented in such a manner to form a plurality of spaced apart vertical slots 141 and two opposite ends, at least one of the opposite ends being formed with an insert hole 11. As best shown in FIGS. 4 and 5, each of the space limiting units 10 consists of a first limiting block 12 and a second limiting block 13 coupled to the first limiting block 12. Each of the first and second limiting blocks 12, 13 has the plug-in surface 14 and a joint surface 15 opposite to the plug-in surface 14 and is dented in such a manner to define a shallow recess 151 with an access 152 such that when the joint surfaces 15 of the first and second limiting blocks 12, 13 are coupled to each other, the pair of accesses 152 cooperatively define the insert hole 11 in each of the space limiting units 10.

In this embodiment and as best shown in FIG. 4, each joint surface 15 of a respective one of the first and second limiting blocks 12, 13 is formed with a plurality of plug units 153 and socket units 155 spaced apart from one another such that each socket unit 155 has a socket hole 154 such that once the joint surfaces 15 of the first and second limiting blocks 12, 13 are attached together, the plug units 153 extend respectively into the socket holes 154 in the socket units 155 after attachment, thereby interactively connecting the first and second limiting blocks 12, 13 to define a respective one of the space limiting units 10.

Referring again to FIG. 4, each joint surface 15 of a respective one of the first and second limiting blocks 12, 13 is formed with a plurality of rod-confining elements 156. Each rod-confining element 156 includes a connection part 1561 extending outwardly from a bottom surface of the shallow recess 151, a restricting part 1562 integrally formed with the connection part 1561 and a confining part 1563. Each joint surface 15 of a respective one of the first and second limiting blocks 12, 13 is further formed with a plurality of rod-abutting sticks 16 adjacent to the rod-confining elements 156, each rod-abutting stick 16 extending outwardly from the bottom surface of the shallow recess 151. The purpose of the rod-confining elements 156 and the rod-abutting sticks 16 will be disclosed in the following paragraphs.

The fixing rods 20 extend into and abut with the plurality of space limiting units 10 respectively, thereby interactively connecting the fixing rods 20 and the spaced limiting units 10. Note that in this embodiment due to preceding connection, the rod-confining elements 156 of the first and second limiting blocks 12, 13 encircle around a portion of an external surface of a respective one of the fixing rods 20 while the rod-abutting sticks 16 of the first and second limiting blocks 12, 13 abut against the remaining portion of the external surface of the respective one of the fixing rods 20 such that the fixing rod 20 is retained stably and securely between the first and second limiting blocks 12, 13 of the space limiting unit 10.

One of the side plates 30 has one end portion connected to one end of the fixing rod 20 while the other end of the fixing rod 20 is connected to remaining one of the side plates 30 in such a manner that the plurality of fixing rods 20 extend parallel to one another between the side plates 30 in such a manner to define an insertion chamber 21 between an adjacent pair of the fixing rods 20.

Each positioning plate 40 has two opposite insert ends 42 extending into the vertical slots 141 in the plug-in surfaces 14 of an adjacent pair of the limiting units 10, thereby erecting the positioning plate 40 vertically in the insertion chamber 21 such that an adjacent pair of two positioning plates 40 cooperatively define a reception chamber 46 therebetween. Each positioning plate 40 further has two opposite sides respectively defining two positioning surfaces 43, each is formed with a plurality of vertical positioning ribs 44 and a plurality of horizontal positioning ribs 45 transversely extending between and interconnecting an adjacent pair of the vertical positioning ribs 44, the purpose of which will be explained in the following paragraphs.

Figure 3:
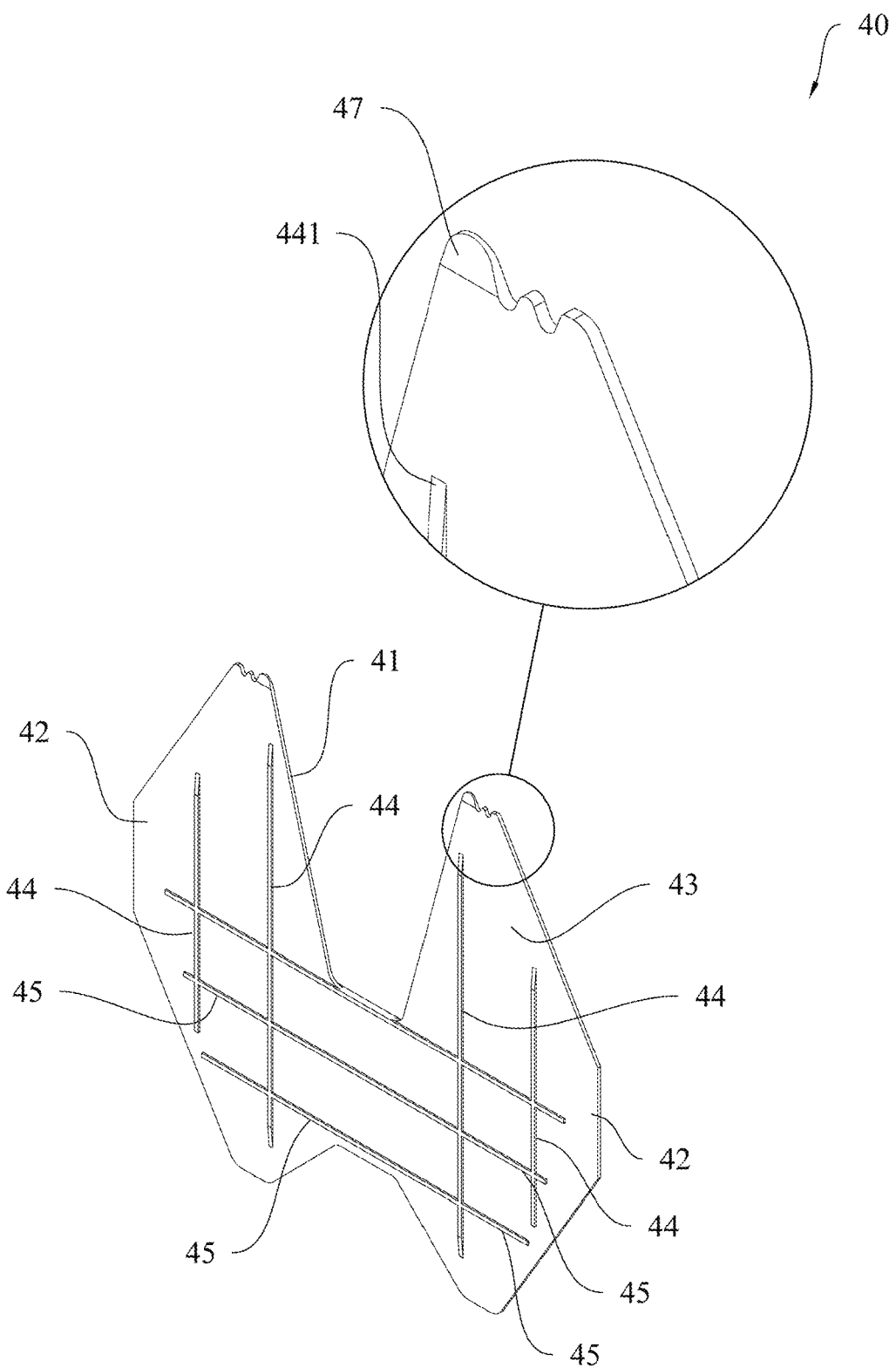
FIG. 3 is an enlarged view of a positioning plate employed in the storage frame structure for automatic depot according to the first embodiment of the present invention.

Moreover, in this embodiment, each positioning plate 40 and the plug-in surface 14 of a respective one of the space limiting units 10 extend perpendicularly relative to each other such that an adjacent pair of the positioning plates 40 define the reception chamber 46 vertically therebetween such that a material tray 50 can be retained vertically in the reception chamber 46. It is to note that each positioning plate 40 has two top ends and a middle portion between the two top ends and formed with an opening 41 at the middle portion of a respective one of the positioning plates 40, as best shown in FIGS. 3 and 5. Also note that each of the plurality of vertical positioning ribs 44 defines an inclined guiding portion 441 adjacent to a respective one of the two top ends of the positioning plate 40 for guiding the material tray 50 towards a center of the reception chamber 46, where the vertical and horizontal positioning ribs 44, 45 of a respective positioning plate 40 are in contact with one outer side surface of the material tray 50 so as to secure retention of the material tray 50 within the reception chamber 46. In this embodiment, the two top ends 47 of each of the positioning plates 40 gradually diverge toward the middle portion in order to define the opening 41 at the middle portion such that the opening 41 is located at a level below the two top ends 47 of a respective one of the positioning plates 40.

A plurality of material trays 50, each material tray 50 consists of two-piece body 51 and a tube 52 interconnected the centers of the two-piece body 51, wherein each of the plurality of vertical positioning ribs 44 defines an inclined guiding portion 441 adjacent to a respective one of the two top ends 47 of the positioning plate 40 for guiding the material tray 50 towards a center of the reception chamber 46 between the two positioning plates 40.

Figure 7:
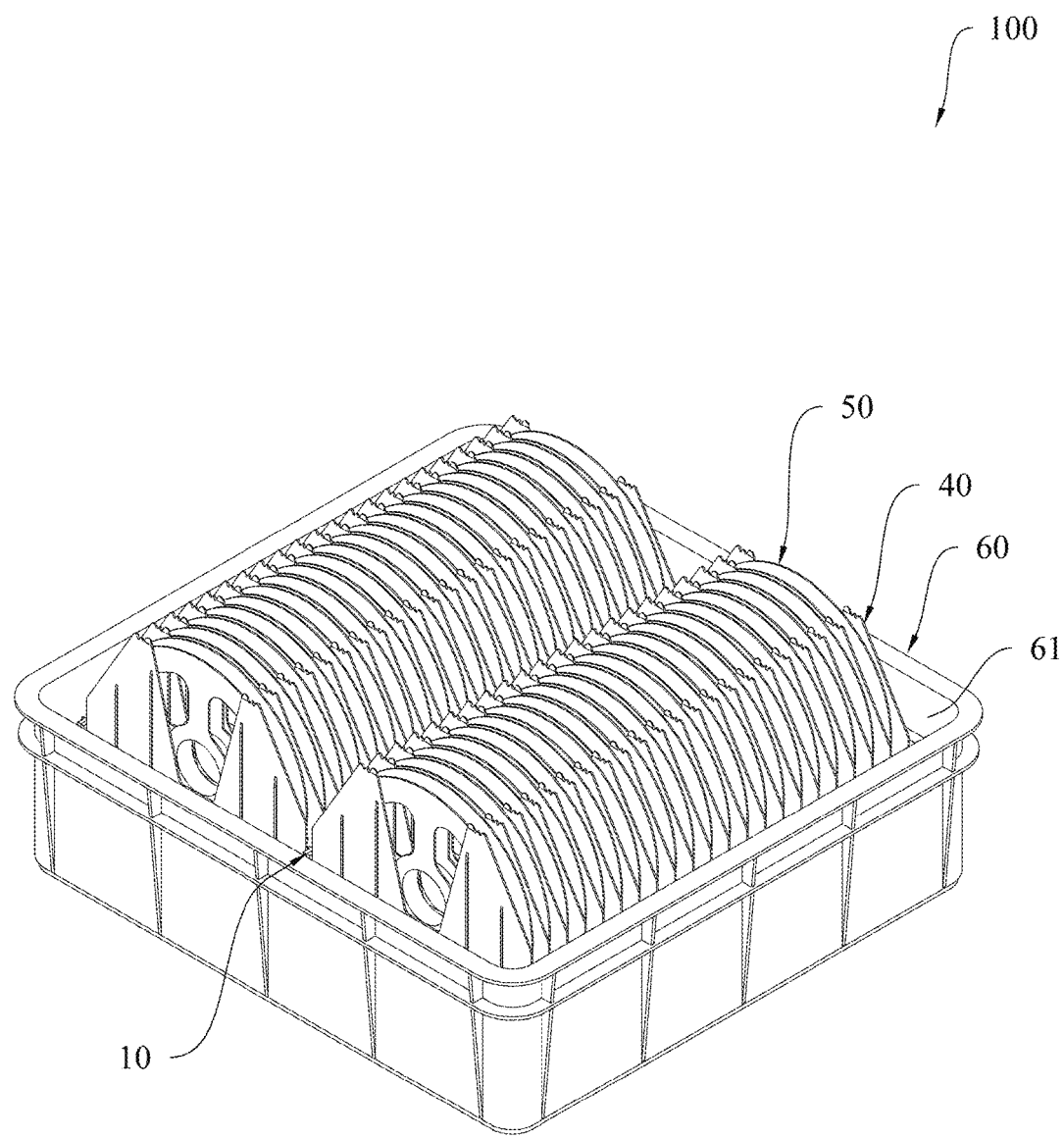
FIG. 7 shows a perspective view of the storage frame structure for automatic depot according to the present invention in a first use mode.
Figure 8:
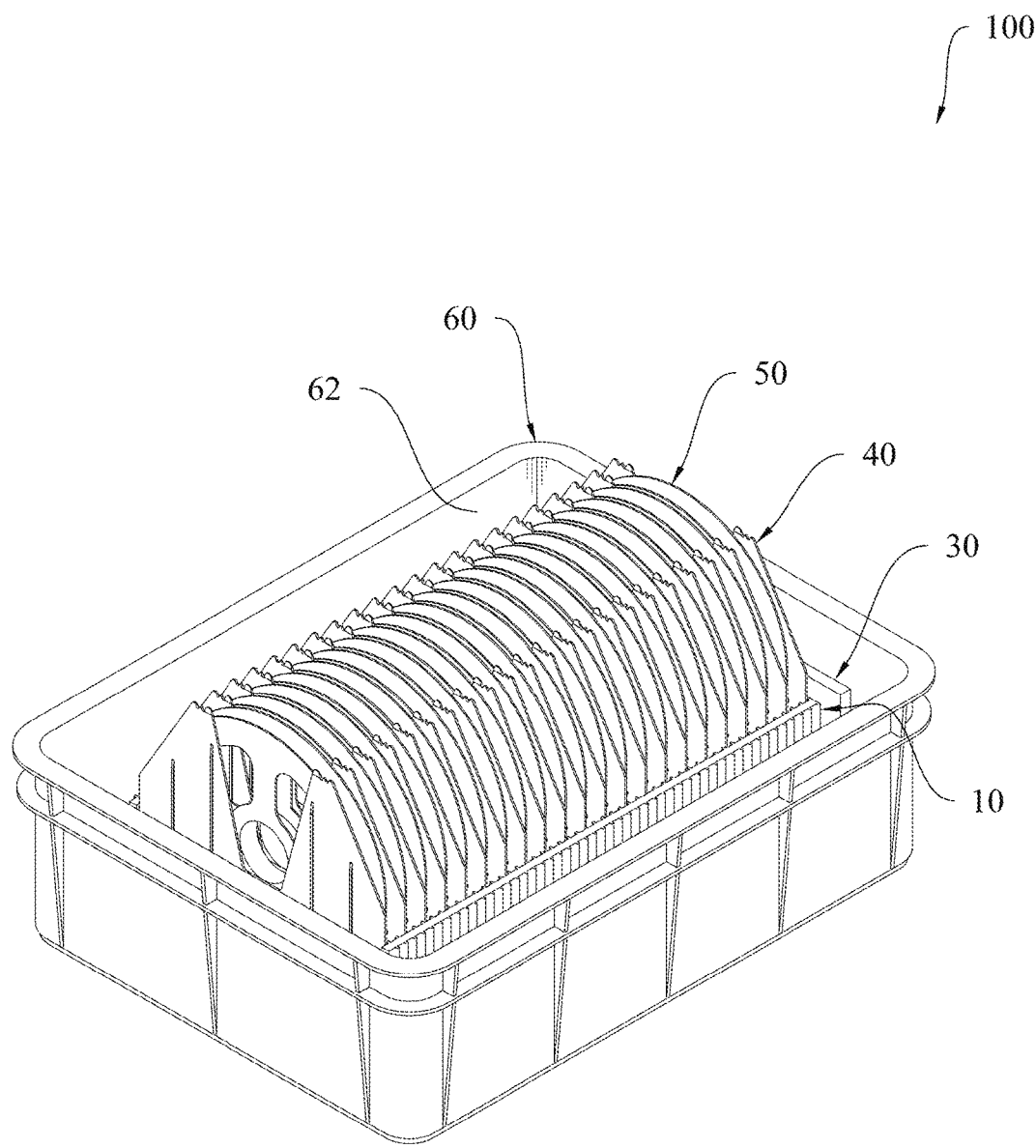
FIG. 8 shows a perspective view of the storage frame structure for automatic depot according to the present invention in a second use mode.

Referring to FIG. 7, the storage frame structure of the present invention further includes a material box 60 fabricated from anti-static composite plastic materials and defining an accommodation room 61, in which the space limiting units 10, the fixing rods 20 and the side plates 30 are accommodated.

The following illustrations are used for further understanding the application of the storage frame structure of the present invention in a SMT automation system.

Figure 9:
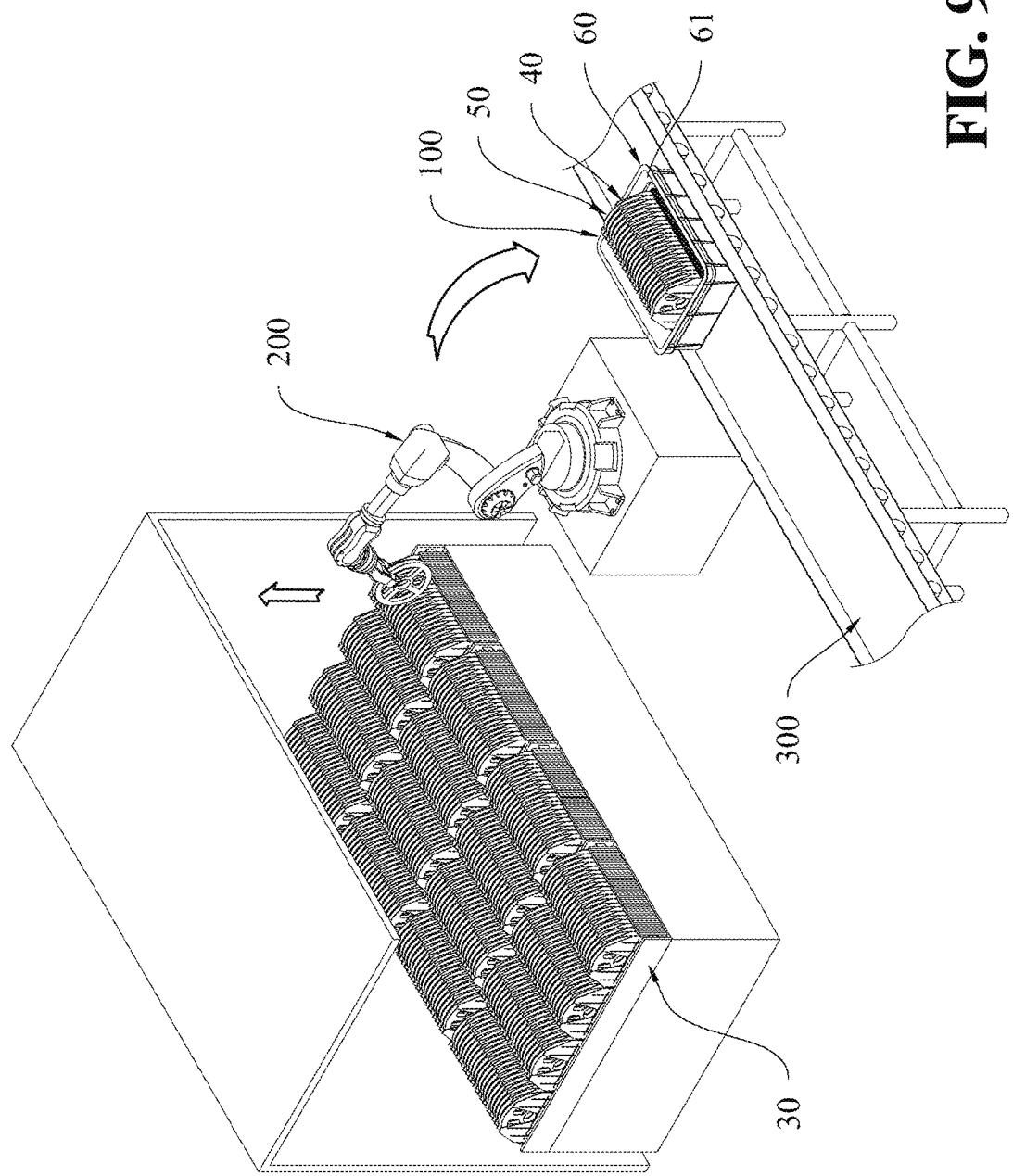
FIG. 9 shows a perspective view of the storage frame structure for automatic depot according to the present invention in a third use mode.

Referring to FIGS. 5, 6 and FIGS. 7, 8 and 9 which illustrate the storage frame structure according to the present invention in different use modes for automatic depot. A signal or command is inputted when it is desired to fetch a specific material tray 50, as best shown in FIG. 9, where a corresponding classification and identification of the specific material tray 50 is performed to determine if the specific material tray 50 is located in a certain material box 60 such that the clamping device 200 moves toward an entrance of the automatic depot and after identification of the specific material tray 50, the clamping device 200 fetches the specific material tray 50 from the certain material box 60 via clamping and places the same onto another material box 60 on a conveyor belt 300, which moves towards its destination upon sensing present of the specific material tray 50 thereon.

Referring to FIGS. 5-8, since the storage frame structure is an assemble-type, the side plates 30 can be detachably connected to a plurality of the fixing rods 20 and after which a plurality of space limiting units 10 are integrated to the fixing rods 20 in such a manner that once two opposite insert ends of a certain number of the positioning plates 40 are inserted into vertical slots 141 in the space limiting units 10, a reception chamber 46 of variable size is defined between an adjacent pair of the positioning plates 40. In addition, The storage frame structure further includes a material box 60 fabricated from anti-static composite plastic materials and defining an accommodation room 61, in which the fixing rods 20 and the side plates 30 are accommodated such that one of the side plates 30 has one end portion connected to one end of the fixing rod 20 while the other end of the fixing rod 20 is connected to the remaining one of the side plates 30.

To be more specific, the space limiting units 10 can be detachably connected to a plurality of the fixing rods 20 in such a manner that once two opposite insert ends of a certain number of the positioning plates 40 are inserted into vertical slots 141 in the space limiting units 10, a reception chamber 46 of variable size is defined between an adjacent pair of the positioning plates 40. Note the dimension of the reception chamber 46 differs depending on extension of the insert ends of the positioning plates 40 into the position of the vertical slots 141 in the space limiting units 10 for retention of different size material tray 50. Since the connection between the side plates 30 and the fixing rods 20 can result in expansion space and can be applied in the automatic depot, the application of which results in an effective way to achieve an orderly classification, speed up the automatic storage system of material access.

One aspect to note is that the storage frame structure of the present invention can be disposed in the material box 60 excluding the side plates 30, where two opposite ends of a respective fixing rod 20 extend into two opposite inner side walls of the material box 60. In other words, the opposite inner side walls of the material box 60 functions as the side plates 30.

Another aspect to note is that the space limiting units 10 can be detachably connected to the fixing rods 20 in such a manner that once two opposite insert ends of a certain number of the positioning plates 40 are inserted into vertical slots 141 in the space limiting units 10, a reception chamber 46 of variable size as required by the user is defined between an adjacent pair of the positioning plates 40 so that a plurality of material trays 50 can be inserted in the reception chamber 46.

Note the dimension of the reception chamber 46 differs depending on extension of the insert ends of the positioning plates 40 into the position of the vertical slots 141 in the space limiting units 10. Each positioning plate 40 further has vertical positioning ribs 44 with the inclined guiding portion 441 for guiding the material tray 50 towards a center of the reception chamber 46, where the vertical and horizontal ribs 44, 45 cooperatively abut the outer side surface of the material tray 50 so as to secure retention of the material tray 50 in the reception chamber 46. Due to presence of the opening 41 which diverges from the top ends 47 toward a lower level at the central portion of the positioning plate 40, the clamping device 200 can access into the reception chamber 46 via the opening 41 in order to stably and firmly clamping of the material tray 50 during fetching and/or storing process.

The storage frame structure 100 provides the following advantages.

Since the storage frame structure 100 for automatic depot of the present invention is an assemble-type and is assembled by the side plates 30 and the fixing rods 20, after which a plurality of space limiting units 10 are integrated to the fixing rods in such a manner that once two opposite insert ends of a certain number of the positioning plates 40 are inserted into vertical slots in the space limiting units 10, the reception chamber of variable size is defined between an adjacent pair of the positioning plates 40. The positioning plates 40 further have vertical positioning ribs 44 for guiding the material tray 50 into the reception chamber 46, where the vertical positioning ribs 44 abut an outer side surface of the material tray 50 so as to retain the material tray 50 in the reception chamber 46.

The storage frame structure 100 of the present invention has simple construction and is therefore easy to maintain in addition to stably retaining the material tray 50. Moreover, the storage frame structure 100 is suitable to be applied automatic depot system (such as SMT electronic industry) for automatic material storage and sorting.

The storage frame structure 100 of the present invention can provide orderly classification, quicken the delivery and transportation, and shorten the time of material search and identification, shortened material fetching time, enhance production efficiency and increasing shelf space utilization, and further savings the manual labor costs.

The storage frame structure 100 of the present invention has better anti compressive and bending strength in addition to swiftly and quickly retain the material tray 50 of variable size in the reception chamber 46.

The storage frame structure 100 of the present invention provides enhanced space utilization and efficient storage space when compared to the prior art ones and further provides high efficiency of SMT electronic industry if applied therein. Moreover, management of the material tray 50 including variable sizes can also be effectively enhanced.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A storage frame structure for an automatic depot, comprising:
   a plurality of space limiting units, each space limiting unit having a plug-in surface dented in such a manner to form a plurality of spaced apart vertical slots and two opposite ends, at least one of said opposite ends being formed with an insert hole;
   a plurality of fixing rods abutting with said plurality of space limiting units respectively;
   at least two side plates, one of said side plates having one end portion connected to one end of said fixing rod while the other end of said fixing rod is connected to remaining one of said side plates in such a manner that said plurality of fixing rods extend parallel to one another between said side plates in such a manner to define an insertion chamber between an adjacent pair of said fixing rods; and
   at least two positioning plates, each positioning plate having two opposite insert ends extending into said vertical slots in said plug-in surfaces of an adjacent pair of said limiting units, thereby erecting said positioning plate vertically in said insertion chamber such that said two positioning plates cooperatively define a reception chamber therebetween, each positioning plate further having two opposite sides respectively defining two positioning surfaces, each is formed with a plurality of vertical positioning ribs and has two top ends and a middle portion between said two top ends and formed with an opening at said middle portion of a respective one of said positioning plates.

2. The storage frame structure according to claim 1, further comprising a material tray consisting of two-piece body and a tube interconnecting centers of said two-piece body, wherein each of said plurality of vertical positioning ribs defines an inclined guiding portion adjacent to a respective one of said two top ends of said positioning plate for guiding said material tray towards a center of said reception chamber between said two positioning plates.

3. The storage frame structure according to claim 2, wherein each positioning surface of a respective one of said positioning plates further has a plurality of horizontal positioning ribs transversely extending between and interconnecting an adjacent pair of said vertical positioning ribs such that said vertical and horizontal positioning ribs are in contact with one outer side surface of said material tray so as to secure retention of said material tray within said reception chamber.

4. The storage frame structure according to claim 2, wherein said two top ends of each of said positioning plates gradually diverge toward said middle portion in order to define said opening at said middle portion such that said opening is located at a level below said two top ends of a respective one of said positioning plates so as to permit access of an external clamp device for fetching and storing by clamping a center of said material tray.

5. The storage frame structure according to claim 1, wherein each of said space limiting units includes a first limiting block and a second limiting block coupled to said first limiting block, each of said first and second limiting blocks having said plug-in surface and a joint surface opposite to said plug-in surface and is dented in such a manner to define a recess with an access such that when said joint surfaces of said first and second limiting blocks are coupled to each other, said pair of accesses cooperatively define said insert hole in said first and second limiting blocks.

6. The storage frame structure according to claim 5, wherein each joint surface of a respective one of said first and second limiting blocks is formed with a plurality of plug units and socket units spaced apart from one another such that each socket unit has a socket hole.

7. The storage frame structure according to claim 6, wherein once said joint surfaces of said first and second limiting blocks are attached together, said plug units extend respectively into said socket holes in said socket units after attachment, thereby interactively connecting said first and second limiting blocks to define a respective one of said space limiting units, each joint surface of a respective one of said first and second limiting blocks is formed with a plurality of rod-confining elements, each including a connection part extending outwardly from a bottom surface of said recess, a restricting part integrally formed with said connection part and a confining part encircling around a portion of an external surface of a respective one of said fixing rods such that said fixing rod is retained between said first and second limiting blocks.

8. The storage frame structure according to claim 5, wherein each joint surface of a respective one of said first and second limiting blocks is formed with a plurality of rod-abutting sticks adjacent to said rod-confining elements, each rod-abutting stick extending outwardly from said bottom surface of said recess for abutting the remaining portion of said external surface of a respective one of said fixing rods such that said fixing rod is retained stably and securely between said first and second limiting blocks.

9. The storage frame structure according to claim 5, wherein each of said positioning plates and said plug-in surface of a respective one of said space limiting units extend perpendicularly relative to each other such that an adjacent pair of said positioning plates define said reception chamber vertically therebetween.

10. The storage frame structure according to claim 1, further comprising a material box fabricated from anti-static composite plastic materials and defining an accommodation room, in which said space limiting units, said fixing rods and said side plates are accommodated.

\* \* \* \* \*